United States Patent [19]

Seaks, Jr.

[11] Patent Number: 4,516,189
[45] Date of Patent: May 7, 1985

[54] CONTROL APPARATUS HAVING MODULAR CONSTRUCTION

[75] Inventor: Charles E. Seaks, Jr., Greenfield, Wis.

[73] Assignee: Johnson Service Company, Milwaukee, Wis.

[21] Appl. No.: 584,752

[22] Filed: Feb. 29, 1984

[51] Int. Cl.³ .............................................. H05K 7/16
[52] U.S. Cl. .................................. 361/426; 339/17 C; 339/198 GA; 339/198 H
[58] Field of Search ............... 361/331, 376, 380, 393, 361/394, 395, 399, 407, 426–429; 339/198 GA, 198 H, 17 C

[56] References Cited

U.S. PATENT DOCUMENTS

| | | | |
|---|---|---|---|
| 2,907,926 | 10/1959 | Slack | 361/395 |
| 2,928,998 | 3/1960 | Brumfield | 361/376 |
| 4,401,351 | 8/1983 | Record | 361/395 |
| 4,472,764 | 9/1984 | Richard | 361/407 |

FOREIGN PATENT DOCUMENTS

| | | |
|---|---|---|
| 2601849 | 7/1977 | Fed. Rep. of Germany ...... 339/198 GA |
| 2651589 | 5/1978 | Fed. Rep. of Germany ...... 339/198 GA |

Primary Examiner—G. P. Tolin
Attorney, Agent, or Firm—Larry L. Shupe; Joseph J. Jochman, Jr.; John P. Ryan

[57] ABSTRACT

In general, an electronic control module includes a module frame adapted for swingable mounting to a rail member. The module includes a plurality of bus conductors constructed and arranged to engage the bus conductors of adjacent modules when mounted. The module also includes a plurality of electrically-conductive pads for engaging a circuit board which is attachable to the module frame. Terminals are included for the connective termination of external wiring. The module is swingably removable from a rail member while yet avoiding movement of a module which may be mounted adjacent thereto. The invention is particularly useful for the construction of electronic digital communication systems used with heating, ventilating and air conditioning equipment.

11 Claims, 9 Drawing Figures

CONTROL APPARATUS HAVING MODULAR CONSTRUCTION

FIELD OF THE INVENTION

This invention relates to modular electrical control systems and more particularly to a control module readily usable to assemble an electronic communication system. The modules may be conveniently constructed to permit service replacement of a module without disturbing adjacent units.

BACKGROUND OF THE INVENTION

In electronic control systems, it is frequently desirable that its components be constructed in a modular manner to permit the replacement of a system component without disturbing other components. This approach is desirable for reasons related to possible malfunction and resultant service requirements or to changes which are required to be made in the system configuration. Yet another reason for modular construction is that portions of the control modules may be made identical one to the other or nearly so in order that certain manufacturing economies may be realized. Still another reason for such construction is that it permits configuration of a wide variety of system architectures using a plurality of relatively standardized modules.

One approach to the construction of a modular system is shown and described in West German Offenlegungsschrift No. 2 205 086. The modules shown therein are formed of substantially identical housings, each having screw-type terminals for the connection of incoming and outgoing electrical wires. Electrical power is supplied to the modules through a pin type cross connecting system whereby the modules are required to be plugged or assembled together prior to gang mounting of the modules upon a support rail.

Yet another approach to modular design is shown in U.S. Pat. No. 2,910,672 wherein intermodule connection is by a plurality of pins projecting from one side of a module, the pins being received into appropriate sockets formed in the opposite side of the adjacent module. System assembly is by sequentially stacking the modules after which the modules are maintained in an electrically-connective relationship by a throughbolt. Other ways of using a modular approach in system construction are shown and described in U.S. Pat. Nos. 3,403,300 and 3,373,319.

While these approaches to modular system construction have heretofore been satisfactory, they tend to be characterized by certain disadvantages. In particular, they have failed to appreciate the manner in which modules may be constructed to permit swingable module mounting and removal whereby any module may be removed and replaced without disturbing adjacent modules. Additionally, they have failed to appreciate the manner by which a module may be constructed using a plurality of bus conductors which are constructed and arranged to engage the bus conductors of adjacent modules. The bus conductors may thereby define a system power bus for providing electrical power to the modules and may also define a system communication bus for providing a module communication channel. An electronic control module which is adapted for swingable mounting to a rail member, which includes a plurality of bus conductors for providing system electrical power and communication links, which is adapted to be individually removable and replaceable without disturbing adjacent modules and which includes a frame for receiving an electrical circuit board having any one of a variety of circuit configurations would be a distinct advance in the art.

SUMMARY OF THE INVENTION

In general, an electronic control module includes a module frame adapted for swingable mounting to a rail member. The module includes a plurality of bus conductors constructed and arranged to engage the bus conductors of adjacent modules when mounted. The module also includes a plurality of electrically-conductive pads for engaging a circuit board which is attachable to the module frame. Terminals are included for the connective termination of external wiring. The module is swingably removable from a rail member while yet avoiding movement of a module which may be mounted adjacent thereto. The invention is particularly useful for the construction of electronic digital communication systems used with heating, ventilating and air conditioning equipment.

It is an object of the present invention to provide a control module having a frame adapted for swingable mounting to a rail member.

It is another object of the present invention to provide a control module which includes a plurality of bus conductors constructed and arranged to engage, when mounted, bus conductors of adjacent modules.

Yet another object of the present invention is to provide an electronic control module which includes a plurality of pads for engaging an electrical circuit board attachable to the module frame.

Still another object of the present invention is to provide a control module useful for constructing an electronic digital communication system in which each of the control modules has a frame of an electrical configuration which is substantially identical for all control modules.

Another object of the present invention is to provide a control module useful for constructing an electronic digital communication system in which a module may be easily, swingably removed or replaced while avoiding movement of adjacent modules. How these and other objects are accomplished are described in the specification taken in conjunction with the accompanying drawing.

DESCRIPTION OF THE PREFERRED EMBODIMENTS

Figure 1:
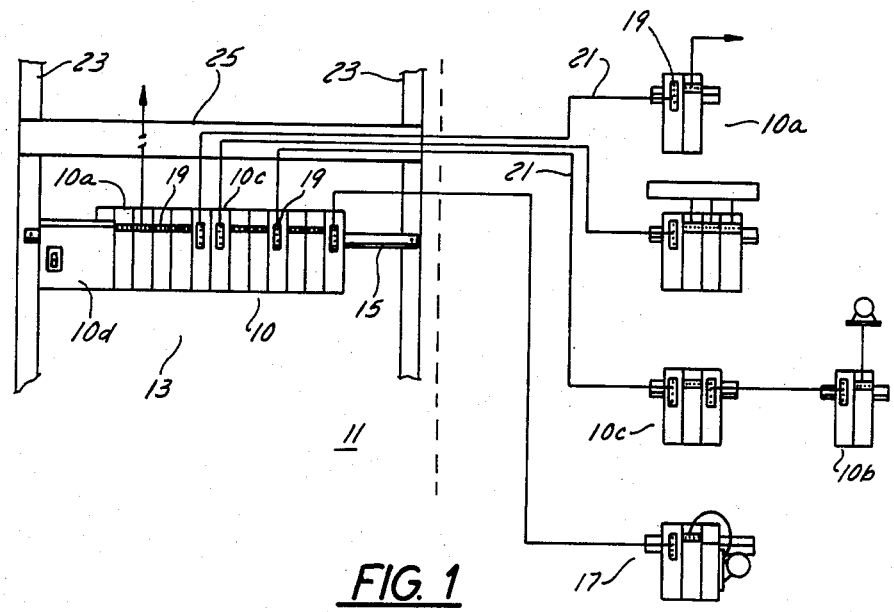
FIG. 1 is a simplified schematic diagram of a modularly-constructed electronic digital control system utilizing the control module of the present invention.

In FIG. 1, the inventive control module 10 is shown in connection with a communication system 11 for use on environmental control apparatus such as heating, ventilating and air conditioning equipment. The system 11 may be constructed using the module 10 and includes a collected point section 13 comprising a plurality of control modules 10 mounted upon a rail 15. The collected point section 13 is usually disposed in a central control room located within, for example, an office building or factory. Distributed throughout the building may be other rail mounted point control modules 10a which may be coupled to environmental parameter sensors such as temperature or humidity sensors. Yet other control modules 10b may be controllably coupled to heat generating systems, air conditioners and the like (not shown). Still other control modules may be configured as a type defining a gateway module 10c for convertibly effecting communications between the system 11 and external apparatus coupled to the gateway module 10c which employs a communication form different from that used by the system 11. Yet other first point modules 10a or second gateway modules 10c may be included within the collected point section 13. Modules within the collected point section 13 may be connected with modules in the distributed point section 17 by terminals 19 adapted for securing the interconnective wiring 21. The collected point section 13 may also include a module 10d of a third type for providing electrical power to the remaining modules. When arranged in the fashion shown, the communication system 11 will be effective to transmit to the collected point section 13 digitally-coded signals from exemplary temperature and humidity sensors located within the distributed point section 17. The collected point section 13 will compare actual values of these parameters with set point values programmed into the section 13 and generate command signals for controlling the heating, ventilating and air conditioning equipment.

Figure 2:
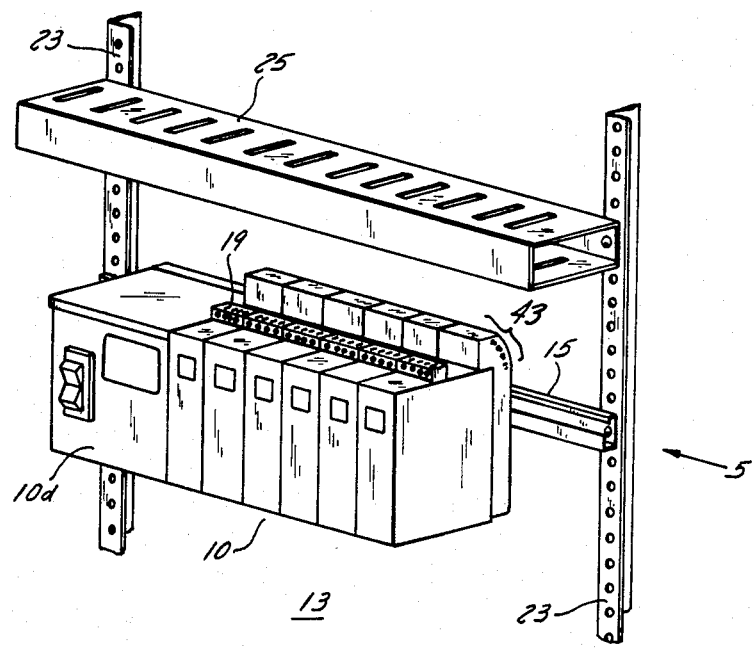
FIG. 2 is an isometric view of the collected point portion of the system of FIG. 1.

A typical collected point section 13 is shown in FIG. 2 to include a power supply module 10d and a plurality of control modules 10 mounted on a support rail 15 in a closely spaced relationship one to the other. The mounting rail 15 is supported at either end thereof by a pair of support posts 23 adapted for free-standing or wall mounting. Wiring 21 used for connecting the collected point section 13 with those modules comprising the distributed point section 17 may be placed in a wiring channel 25 attached to the support posts 23 at a location slightly above the modules 10.

Figure 3:
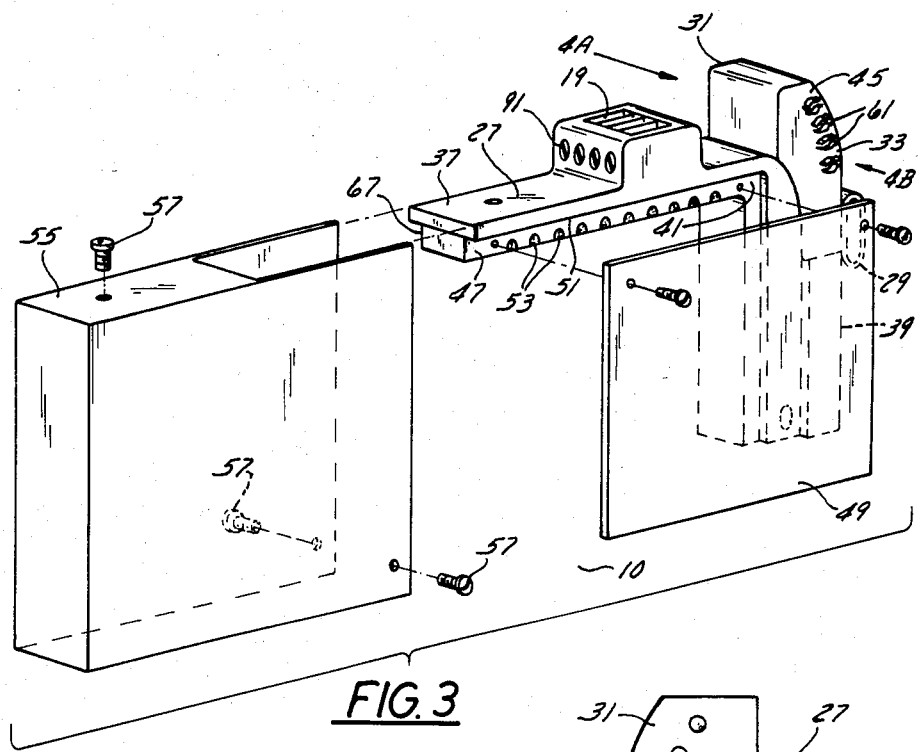
FIG. 3 is an exploded view of the control module of the present invention with portions shown in phantom.

Referring additionally to FIG. 3, a control module 10 is shown to include a module frame 27 formed of an insulating material and having support means 29 for swingably mounting the frame to a rail 15. The frame 27 includes a first surface 31 and a second surface 33, the surfaces 31, 33 being generally planar and spaced apart one from the other by a dimensional width. While control modules such as module 10 may be constructed to have varying widths, it is convenient from a manufacturing and interchangeable installation standpoint that the widths of all control modules 10 be identical one to the other. The frame 27 also includes a first leg 37 and a second leg 39 attached one to the other and defining an apex 41 therebetween and a preferred frame 27 may be conveniently molded of a plastic material. Molded within the frame 27 is a first connection means 43 comprising a plurality of bus conductors 45 constructed and arranged to be electrically insulated one from the other and to engage the bus conductors 45 of adjacent modules 10 when the frame 27 is swingably mounted to a location on the rail 15. Configured within the frame 27 is an inletted, generally L-shaped channel 47 formed to a depth and sized to receive an electrical circuit board 49 in closely-fitting engagement with the channel edges 51. A plurality of electrically conductive pressure pads 53 are disposed in spaced-apart, electrically-insulated relationship along that portion of the frame 27 comprising the first leg 37. The size and location of these pads 53 is selected to align with similar pads (not shown) formed along the upper interior edge of the circuit board 49. These pads 53 include a first group of at least four pads for providing electrical power and digital communications connections between the frame 27 and the circuit board 49 and a second group of at least two pads for electrically connecting the circuit board 49 to a pair of terminals 19 adapted for the connective termination of external wiring. It is to be appreciated that the power, digital communication and circuit board connection pads and related terminals are not specifically identified since the selection of particular pads and terminals is one of design choice. In order to protect and enclose the circuit board 49, a generally U-shaped cover 55 may be formed for closely-fitted, sliding engagement with the frame 27. Cover attachment may be by screws 57 or other suitable means. If radio frequency (RF) shielding is desired or required, this cover 55 may be formed of sheet metal.

Figure 4A:
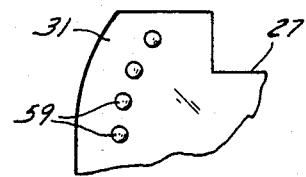
FIGS. 4A and 4B depict details of the module frame bus conductor arrangement as viewed along axes 4A and 4B, respectively, of FIG. 3 and with portions broken away.
Figure 4B:
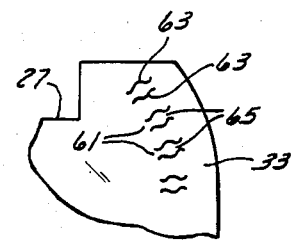

FIGS. 4A and 4B depict, respectively, portions of the first surface 31 and the second surface 33 of the module 10 and illustrate the construction and arrangement of the bus conductors 45 comprising the first connection means. Each of the bus conductors 45 includes a conductor pin 59 slightly projecting from the first surface 31 for engaging the bus conductor 45 of a module 10 disposed adjacent thereto. Those portions of the bus conductors 45 slightly protruding from the second surface 33 include a plurality of spring clips 61, each clip 61 having a pair of generally C-shaped flanges 63 mounted in face-opposing relationship one to the other and having outwardly turned edges for defining a pair of opposingly-disposed pin passages 65 therethrough. Each pin 59 of a control module 10 is electrically connected to its associated clip 61 and it will be appreciated from the foregoing that the clips 61 are adapted to receive and electrically connect with the pins 59 of a control module 10 disposed adjacent the second surface 33 and slidably entering each clip 61 through either passage 65. It is also to be appreciated that the bus conductor 45 formed by each pin 59 and its corresponding clip 61 is electrically connected to a predetermined pressure pad 53. Two of the bus conductors 45 so formed may provide electrical power to the module 10 while the remaining two of the bus conductors 45 will provide a module communication link to the system communication bus. It will be appreciated that irrespective of the circuitry of a particular circuit board 49, its power and communications connections may be effected by locating its power and communications terminals to align and contact with the power and communication terminals comprising the first group of pads. Depending upon the complexity of the circuitry required to be provided by the circuit boards 49, a corresponding array of pads may be disposed in the channel 67 formed in the first surface 31 so that circuit boards 49 may be mounted at both the first surface 31 and the second surface 33 of the module 10. In that event, corresponding pads of the first and second channels 47, 67 respectively, would be electrically interconnected.

Figure 5:
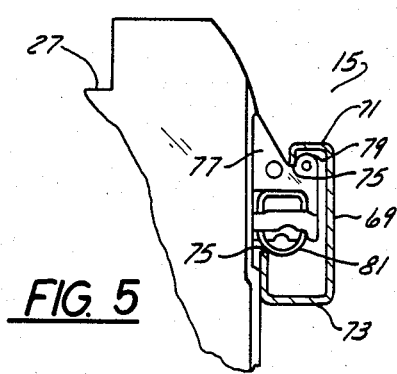
FIG. 5 is a side elevation view of a portion of the control module of the present invention taken along the viewing axis 5 of FIG. 2 and illustrating the manner of attachment of the control module to a mounting rail.

FIG. 5 illustrates an arrangement for permitting the swingable mounting of a control module 10 to a rail 15. As shown therein, a preferred rail 15 has a generally C-shaped section and includes a back plane 69, an upper lip 71 shallowly projecting therefrom and a lower lip 73 more deeply projecting from the back plane 69 to define a pair of horizontally-offset, vertically spaced apart edges 75 for engaging the control module support member 77. The latching lip 79 is retained in a groove formed in the member 77 intermediate the lip 79 and the frame 27. The member 77 also includes a downwardly projecting U-shaped spring-loaded clip 81 which is forced retractably upward as the module 10 is swung toward a locked position and thereafter returns to its illustrated normal position for spring-secure engagement with the lower edge 75.

Figure 6A:
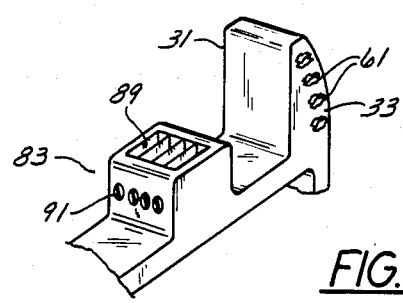
FIGS. 6A, 6B and 6C are isometric views of the control module of the present invention illustrating various configurations of module terminals and with portions broken away.
Figure 6B:
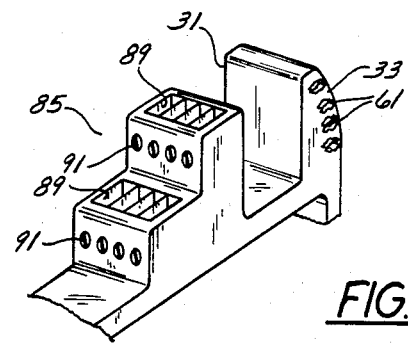
Figure 6C:
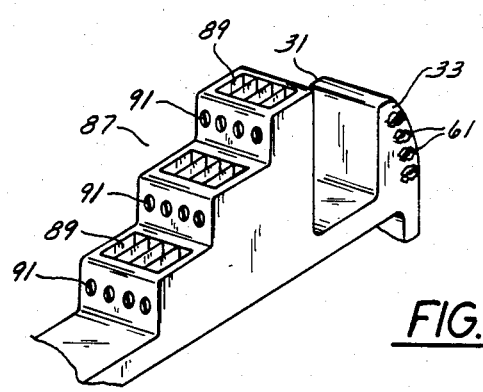

Referring next to FIGS. 6A, 6B and 6C, a plurality of terminal arrangements is shown for the connective termination of external wiring. Depending upon the particular purpose of a control module 10, it may have a single-input terminal 83, a two-input terminal 85, or a three-input terminal 87 as required. Each terminal 83, 85, 87 preferably includes a plurality of pressure connectors 89 by which wiring may be engaged by clamping with the aid of a movable screw 91. Each pressure connector 89 is electrically coupled to a pad 53 within the second pad group, preferably by wires molded within the frame 27.

While only a few embodiments of the invention have been shown and described, it is not intended to be limited thereby, but only by the scope of the claims which follow.

I claim:

1. An electronic control module including:
    a module frame swingably mounted to a rail member and including first, second and third electrical connection means, said module frame further including a latching lip engaging a first edge of a rail member and a resilient clip engaging a second edge of said rail member, said lip, said clip and said edges cooperating and forming means to permit said module to be swingably mounted to and removed from said rail member while avoiding movement of a module mounted adjacent thereto;
    said first connection means including a plurality of bus conductors constructed and arranged to engage the bus conductors of adjacent modules when swingably mounting said frame;
    said second connection means including a plurality of electrically conductive pads for engaging a circuit board attachable to said frame;
    said third connection means including a plurality of terminals adapted for the connective termination of external wiring.

2. The invention set forth in claim 1 wherein said module frame includes a first surface and a second surface, said bus conductors include a conductor pin projecting from said first surface for engaging a bus conductor of a module disposed adjacent said first surface and a conductor clip projecting from said second surface for engaging a bus conductor of a module disposed adjacent said second surface.

3. The invention set forth in claim 2 wherein said plurality of bus conductors includes two conductors for providing electrical power to said module and two conductors for providing a communication link to said module.

4. A control module for use in electronic digital communications systems and including:
    a module frame formed of an insulating material and having support means for swingably mounting said frame to a rail member;
    said frame including a plurality of electrically conductive pads disposed thereon and an electrical circuit board attached thereto;
    said circuit board having a plurality of conductive points in abutting pressure engagement with said pads, said plurality of pads including first and second groups of pads, said first group including at least four pads for providing electrical power and digital communication connections between said frame and said circuit board, said second group including at least two pads for electrically connecting said circuit board to a plurality of terminals adapted for the connective termination of external wiring;
    said frame further including connective terminals and a plurality of bus conductors, each one of said bus conductors being electrically connected to one of said pads, said bus conductors being constructed and arranged to electrically engage bus conductors of other modules mounted adjacent either side of said module;
    said module thereby being electrically connectable to and detachable from adjacent modules while avoiding movement of said adjacent modules.

5. The invention set forth in claim 4 wherein said module includes a first surface and a second surface, said surfaces being generally planar and spaced apart one from the other, said bus conductors projecting slightly from said surfaces for engaging bus conductors of a module disposed adjacent said first surface or said second surface.

6. The invention set forth in claim 5 wherein said frame includes a first leg and a second leg attached one to the other and defining an apex therebetween, said bus conductors being disposed generally at said apex.

7. A modularly-constructed electronic digital communication system for use on environmental control apparatus comprising heating, ventilating and air conditioning equipment and including:
    a plurality of function control modules swingably mounted to a rail member in a closely spaced relationship one to the other, said control modules including at least one module of a first point module type for electrically transmitting control commands to environmental control apparatus and for receiving sensor signals from said apparatus;
    each of said control modules including a module frame of an electrical configuration substantially identical to all of said control modules;
    each of said frames being adapted to receive any one of a plurality of differently configured circuit boards;
    each of said frames including first connection means in electrically connective engagement with the connection means of other module frames swingably mounted adjacent one another, each of said frames further including a latching lip engaging a first edge of said rail member and a resilient clip engaging a second edge of said rail member, said lip, said clip and said edges cooperating and forming means to permit said control modules to be individually removable while yet avoiding movement of a module mounted adjacent thereto.

8. The invention set forth in claim 7 wherein said first connection means of said modules collectively define a system power bus for providing electrical power to said control modules and further define a system communication bus for providing a communication channel for said modules.

9. The invention set forth in claim 8 wherein said plurality of function control modules includes modules of at least two functional types and the module frames of all of said control modules have a dimension which is substantially identical for all frames, whereby a function module of a first type and of a second type may be substituted one for the other while avoiding movement of an adjacently mounted module.

10. The invention set forth in claim 9 wherein modules of said second type are gateway modules for convertibly effecting communications between said system and external apparatus coupled to said gateway and employing a communication form different from that used by said system.

11. The invention set forth in claim 10 further including a module of a third type for providing electrical power to said functional control modules.

* * * * *